United States Patent
Zhu et al.

(10) Patent No.: US 9,556,018 B2
(45) Date of Patent: *Jan. 31, 2017

(54) THREE-DIMENSIONAL NANO-STRUCTURE ARRAY

(75) Inventors: Zhen-Dong Zhu, Beijing (CN); Qun-Qing Li, Beijing (CN); Li-Hui Zhang, Beijing (CN); Mo Chen, Beijing (CN); Yuan-Hao Jin, Beijing (CN); Shou-Shan Fan, Beijing (CN)

(73) Assignees: Tsinghua University, Beijing (CN); HON HAI PRECISION INDUSTRY CO., LTD., New Taipei (TW)

( * ) Notice: Subject to any disclaimer, the term of this patent is extended or adjusted under 35 U.S.C. 154(b) by 1166 days.

This patent is subject to a terminal disclaimer.

(21) Appl. No.: 13/340,194

(22) Filed: Dec. 29, 2011

(65) Prior Publication Data

US 2013/0089709 A1 Apr. 11, 2013

(30) Foreign Application Priority Data

Oct. 6, 2011 (CN) .......................... 2011 1 0292904

(51) Int. Cl.
- *B32B 3/30* (2006.01)
- *B81C 1/00* (2006.01)
- *B82Y 30/00* (2011.01)

(52) U.S. Cl.
CPC ............ *B81C 1/00111* (2013.01); *B82Y 30/00* (2013.01); *Y10T 428/2457* (2015.01); *Y10T 428/24479* (2015.01)

(58) Field of Classification Search
CPC . Y10T 428/2457; B81C 1/00111; B82Y 30/00
See application file for complete search history.

(56) References Cited

U.S. PATENT DOCUMENTS

| | | | |
|---|---|---|---|
| 5,230,459 A * | 7/1993 | Mueller et al. | ............... 228/164 |
| 5,356,488 A | 10/1994 | Hezel | |
| 5,851,062 A * | 12/1998 | Shinohara et al. | ........... 362/620 |
| 6,670,600 B2 | 12/2003 | Terano et al. | |
| 6,849,389 B2 | 2/2005 | Mahorowala | |
| 7,825,427 B2 * | 11/2010 | Xu | ........................ H01L 33/505 257/100 |
| 8,624,285 B2 * | 1/2014 | Zhu | ........................ H01L 33/24 257/13 |
| 8,629,424 B2 * | 1/2014 | Zhu | ........................ H01L 33/06 257/13 |
| 8,759,857 B2 * | 6/2014 | Zhu | ........................ H01L 33/24 257/79 |

(Continued)

FOREIGN PATENT DOCUMENTS

| CN | 1743783 | 3/2006 |
|---|---|---|
| CN | 101017779 | 8/2007 |

(Continued)

*Primary Examiner* — Donald J Loney
(74) *Attorney, Agent, or Firm* — Zhigang Ma

(57) ABSTRACT

A three-dimensional nano-structure array includes a substrate and a number of three-dimensional nano-structures. Each three-dimensional nano-structure has a first peak and a second peak aligned side by side. A first groove is defined between the first peak and the second peak. A second groove is defined between the two adjacent three-dimensional nano-structures. A depth of the first groove is lower than that of the second groove.

18 Claims, 10 Drawing Sheets

(56) References Cited

U.S. PATENT DOCUMENTS

| | | | | |
|---|---|---|---|---|
| 8,785,955 B2 * | 7/2014 | Zhu | ........................ | H01L 33/24 257/79 |
| 2003/0017420 A1 | 1/2003 | Mahorowala | | |
| 2003/0178626 A1 * | 9/2003 | Sugiyama | ................ | H01L 33/22 257/79 |
| 2006/0042786 A1 | 3/2006 | Chen | | |
| 2007/0138699 A1 | 6/2007 | Wuister et al. | | |
| 2008/0229948 A1 | 9/2008 | Washiya et al. | | |
| 2010/0108056 A1 | 5/2010 | Lin et al. | | |
| 2010/0189154 A1 | 7/2010 | Makino et al. | | |
| 2010/0239819 A1 | 9/2010 | Chuang et al. | | |
| 2010/0267186 A1 * | 10/2010 | Wang | ................ | H01L 31/03528 438/71 |
| 2012/0305063 A1 | 12/2012 | Moslehi et al. | | |

FOREIGN PATENT DOCUMENTS

| | | |
|---|---|---|
| CN | 101177237 | 5/2008 |
| CN | 101423188 | 5/2009 |
| JP | 9-180626 | 7/1997 |
| JP | 2005-249947 | 9/2005 |
| JP | 2008-230027 | 10/2008 |
| JP | 2010-157691 | 7/2010 |
| JP | 2011-13186 | 1/2011 |
| JP | 2011-181404 | 9/2011 |
| TW | 200728937 | 8/2007 |
| WO | WO2011072153 | 6/2011 |

\* cited by examiner

THREE-DIMENSIONAL NANO-STRUCTURE ARRAY

CROSS-REFERENCE TO RELATED APPLICATIONS

This application claims all benefits accruing under 35 U.S.C. §119 from China Patent Application No. 201110292904.2, filed on Oct. 6, 2011 in the China Intellectual Property Office, disclosure of which is incorporated herein by reference. This application is related to applications entitled, "METHOD FOR MAKING THREE-DIMENSIONAL NANO-STRUCTURE ARRAY", filed Dec. 29, 2011 Ser. No. 13/340,221; "METHOD FOR MAKING LIGHT EMITTING DIODE", filed Dec. 29, 2011 Ser. No. 13/340,653; "LIGHT EMITTING DIODE", filed Dec. 29, 2011 Ser. No. 13/340,627; "METHOD FOR MAKING LIGHT EMITTING DIODE", filed Dec. 29, 2011 Ser. No. 13/340,658; "LIGHT EMITTING DIODE", filed Dec. 29, 2011 Ser. No. 13/340,661; "METHOD FOR MAKING LIGHT EMITTING DIODE", filed Dec. 29, 2011 Ser. No. 13/340,662; "LIGHT EMITTING DIODE", filed Dec. 29, 2011 Ser. No. 13/340,643.

BACKGROUND

1. Technical Field

The present disclosure relates to a three-dimensional nano-structure array and a method for making the same.

2. Description of Related Art

Nano materials can be one-dimensional such as carbon nanotube, or two-dimensional such as grapheme. A three-dimensional nano-structure, such as a three-dimensional nano-structure array, is difficult to fabricate. A method for making the three-dimensional nano-structure array usually includes lithographing. However, the cost of lithography is expensive, and the three-dimensional nano-structure fabrication process is complicated.

What is needed, therefore, is to provide a three-dimensional nano-structure array and a low-cost and simple method for making the same.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

References will now be made to the drawings to describe, in detail, various embodiments of the present three-dimensional nano-structure arrays and methods for making the same.

Figure 1:
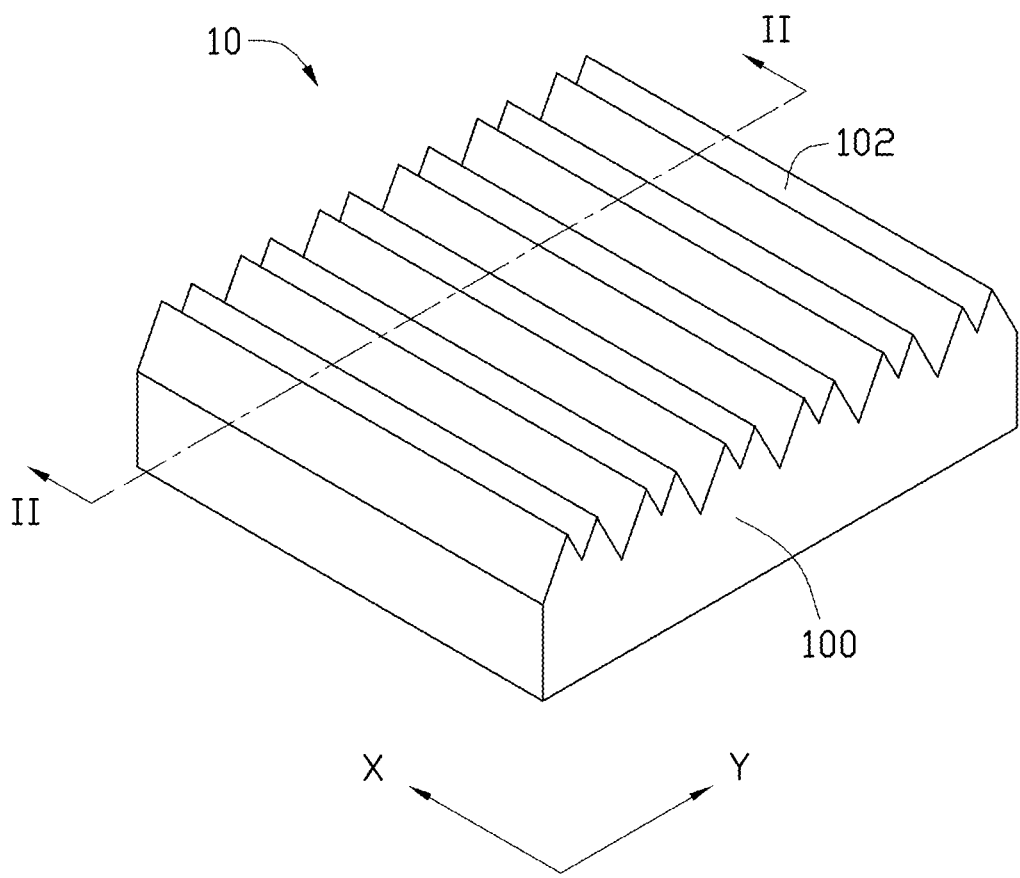
FIG. 1 is an isometric view of one embodiment of a three-dimensional nano-structure array.
Figure 2:
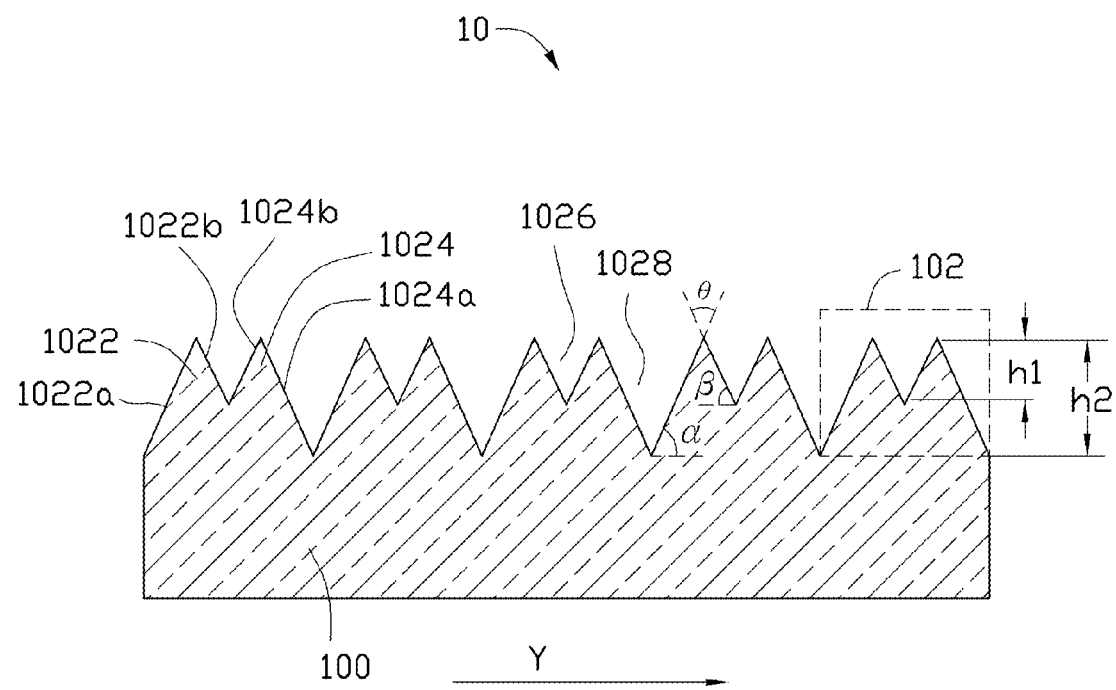
FIG. 2 is a cross-sectional view, along a line II-II of FIG. 1.

Referring to FIGS. 1 and 2, one embodiment of a three-dimensional nano-structure array 10 includes a substrate 100 and a plurality of three-dimensional nano-structures 102 located on at least one surface of the substrate 100. Each of the three-dimensional nano-structures 102 has an M-shaped cross-section. The three-dimensional nano-structure 102 having the M-shaped cross-section will be referred to as an M-shaped three-dimensional nano-structure 102 hereinafter.

The substrate 100 can be an insulative substrate or a semiconductor substrate. The substrate 100 can be made of glass, quartz, silicon (Si), silicon dioxide ($SiO_2$), silicon nitride ($Si_3N_4$), gallium nitride (GaN), gallium arsenide (GaAs), alumina ($Al_2O_3$), or magnesia (MgO). The substrate 100 can also be made of a doped material such as doped N-type GaN or P-type GaN. A size and a thickness of the substrate 100 can be determined according to need. In one embodiment, the substrate 100 is a square sapphire substrate with a GaN semiconductor epilayer grown thereon. A side length of the substrate 100 is about 2 centimeters.

The plurality of three-dimensional nano-structures 102 can be a protruding structure, protruding out from the surface of the substrate 100. The material of the three-dimensional nano-structures 102 can be the same as or different from the material of the substrate 100. The three-dimensional nano-structure 102 can be attached on the surface of the substrate 100, and the three-dimensional nano-structure 102 can also be integrated with the substrate 100 to form an integrated structure.

Figure 3:
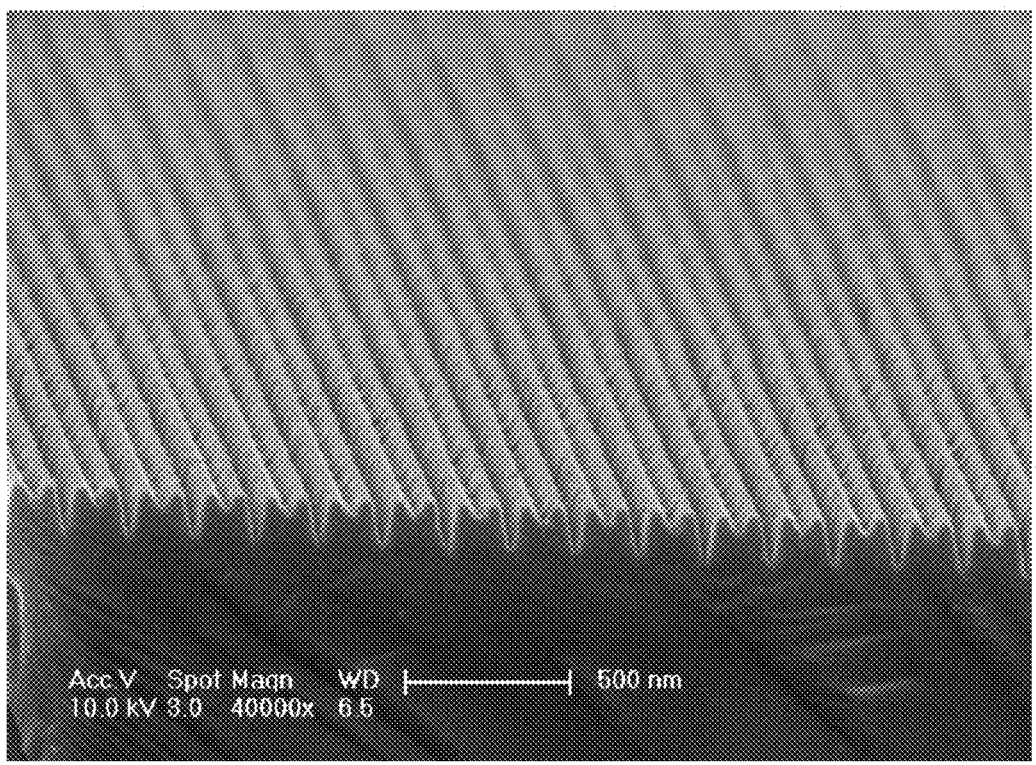
FIG. 3 is a Scanning Electron Microscope (SEM) image of FIG. 1.

The plurality of three-dimensional nano-structures 102 can be arranged side by side. Each three-dimensional nano-structure 102 can extend along a straight line, a curvy line, or a polygonal line. The extending direction is substantially parallel with the surface of the substrate 100. The two adjacent three-dimensional nano-structures are arranged with a certain interval. The distance ranges from about 0 nanometers to about 200 nanometers. The extending direction of the three-dimensional nano-structure 102 can be fixed or varied. If the extending direction of the three-dimensional nano-structure 102 is fixed, the plurality of three-dimensional nano-structures 102 extends substantially along a straight line. In other cases, the three-dimensional nano-structures 102 extends along a polygonal line or a curvy line. The cross-sectional view of the three-dimensional nano-structure 102 along the extending, is in the shape of an "M" with the same area. Referring to FIG. 3, the three-dimensional nano-structures 102 are a plurality of bar-shaped protruding structures extending along a straight line and spaced from each other. The plurality of three-dimensional nano-structures 102 are substantially parallel with each other and extend substantially along the same direction to form an array. The plurality of three-dimensional nano-structures 102 are uniformly and equidistantly distributed on the entire surface of the substrate 100.

The extending direction of the three-dimensional nano-structure 102 is defined as the X direction, and the Y direction is substantially perpendicular to the X direction and substantially parallel with the surface of the substrate 100. The three-dimensional nano-structure 102 extends from one side of the substrate 100 to the opposite side along the X direction. The three-dimensional nano-structure 102 is a double-peak structure including two peaks. The cross-section of the double-peak structure is in the shape of M. Each M-shaped three-dimensional nano-structure 102 includes a first peak 1022 and a second peak 1024. The first peak 1022 and the second peak 1024 extend substantially along the X direction. The first peak 1022 includes a first surface 1022a and a second surface 1022b. The first surface 1022a and the second surface 1022b intersect to form an intersection line and an included angle θ with the first peak 1022. The intersection line can be a straight line, a curvy line, or a polygonal line. The included angle θ is greater than 0 degrees and smaller than 180 degrees. In one embodiment, the included angle θ ranges from about 30 degrees to about 90 degrees. The first surface 1022a and the second surface 1022b can be planar, curvy, or wrinkly. In one embodiment, the first surface 1022a and the second surface 1022b are planar. The first surface 1022a intersects the surface of the substrate 100 at an angle α. The angle α is greater than 0 degrees and less than or equal to 90 degrees. In one embodiment, the angle α is greater than 80 degrees and small than 90 degrees. The first surface 1022a includes a side connected to the surface of the substrate 100, and extends away from the substrate 100 intersecting with the second surface 1022b. The second surface 1022b includes a side connected with the second peak 1024 and extends away from the substrate 100 at an angle β. The angle β is greater than 0 degrees and smaller than 90 degrees.

The second peak 1024 includes a third surface 1024a and a fourth surface 1024b. The structure of the second peak 1024 is substantially the same as that of the first peak 1022. The third surface 1024a and the fourth surface 1024b intersect with each other to form the included angle with the second peak 1024. The third surface 1024a includes a side intersected with the surface of the substrate 100, and extends away from the substrate 100 to intersect with the fourth surface 1024b. The fourth surface 1024b includes a side intersected with the third surface 1024a to form the included angle of the second peak 1024, and extends to intersect with the second surface 1022b of the first peak 1022 to define a first groove 1026. A second groove 1028 is defined between two adjacent three-dimensional nano-structures 102. The second groove 1028 is defined by the third surface 1024a of the second peak 1024 and the first surface 1022a of the first peak 1022 of the adjacent three-dimensional nano-structure 102.

The first peak 1022 and the second peak 1024 protrude out of the substrate 100. The height of the first peak 1022 and the second peak 1024 is arbitrary and can be selected according to need. In one embodiment, both the height of the first peak 1022 and that of the second peak 1024 range from about 150 nanometers to about 200 nanometers. The height of the first peak 1022 can be substantially equal to that of the second peak 1024. Both the first peak 1022 and the second peak 1024 have the highest point. The highest point of the first peak 1022 and the second peak 1024 is defined as the farthest point away from the surface of the substrate 100. In one three-dimensional nano-structure 102, the highest point of the first peak 1022 is spaced from that of the second peak 1024 with a certain distance ranging from about 20 nanometers to about 100 nanometers. The first peak 1022 and the second peak 1024 extend substantially along the X direction. The cross-section of the first peak 1022 and the second peak 1024 can be trapezoidal or triangular, and the shape of the first peak 1022 and the second peak 1024 can be the same. In one embodiment, the cross-section of the first peak 1022 and the second peak 1024 is in the shape of a triangle. The first peak 1022 and the second peak 1022 form the double-peak structure. In one embodiment, the first peak 1022, the second peak 1024, and the substrate 100 form an integrated structure. Because of the limitation of the technology, the first surface 1022a and the second surface 1022b cannot be absolutely planar.

In each M-shaped three-dimensional nano-structure 102, the first peak 1022 and the second peak 1024 define the first groove 1026. The extending direction of the first groove 1026 is substantially the same as the extending direction of the first peak 1022 and the second peak 1024. The cross-section of the first groove 1026 is V-shaped. The depth $h_1$ of the first groove 1026 in different three-dimensional nano-structures 102 is substantially the same. The depth $h_1$ is defined as the distance between the highest point of the first peak 1022 and the bottom of the first groove 1026. The depth of the first groove 1026 is smaller than the height of the first peak 1022 and the second peak 1024.

The second groove 1028 extends substantially along the extending direction of the three-dimensional nano-structures 102. The cross-section of the second groove 1028 is V-shaped or inverse trapezium. Along the extending direction, the cross-section of the second groove 1028 is substantially the same. The depth $h_2$ of the second groove 1028 between each two adjacent three-dimensional nano-structures 102 is substantially the same. The depth $h_2$ is defined as the distance between the highest point and the bottom of the second groove 1028. The depth $h_2$ of the second groove 1028 is greater than depth $h_1$ of the first groove 1026, and the ratio between $h_1$ and $h_2$ ranges from about 1:1.2 to about 1:3 ($1:1.2 \leq h_1:h_2 \leq 1:3$). The depth $h_1$ of the first groove 1026 ranges from about 30 nanometers to about 120 nanometers, and the depth $h_2$ of the second groove 1028 ranges from about 90 nanometers to about 200 nanometers. In one embodiment, the depth of the first groove 1026 is about 80 nanometers, and the depth of the second groove 1028 is about 180 nanometers. The depth of the first groove 1026 and the second groove 1028 can be selected according to need.

The width λ of the three-dimensional nano-structure 102 ranges from about 100 nanometers to about 200 nanometers. The width λ of the three-dimensional nano-structure 102 is defined as the maximum span of the three-dimensional nano-structure 102 along the Y direction. The span of the three-dimensional nano-structure 102 gradually decreases along the direction away from the substrate 100. Thus, in each three-dimensional nano-structure 102, the distance between the highest point of the first peak 1022 and that of the second peak 1024 is smaller than the width of the three-dimensional nano-structure 102. The plurality of three-dimensional nano-structures 102 can be distributed with a certain interval, and the interval can be substantially the same. The interval forms the second groove 1028. The distance $\lambda_0$ between the two adjacent three-dimensional nano-structures 120 ranges from about 0 nanometers to about 200 nanometers. The distance between each two adjacent three-dimensional nano-structures 120 can be substantially the same. The distance $\lambda_0$ can be increased or decreased with the increase or decrease of the height of the first peak 1022 and the second peak 1024. In the Y direction, the distance $\lambda_0$ can be gradually increased, decreased, or periodically varied. If the distance $\lambda_0=0$, the cross-section of the second groove 1028 is V-shaped. If the distance $\lambda_0>0$, the cross-section of the second groove 1028 is in the shape of an inverse trapezium.

Along the Y direction, the plurality of three-dimensional nano-structures 102 is distributed in a certain period P. One period P is defined as the width of the three-dimensional nano-structures 102 $\lambda$ added with the distance $\lambda_0$. The period P of the plurality of three-dimensional nano-structures 102 can range from about 100 nanometers to about 500 nanometers. The period P, the width $\lambda$ and the distance $\lambda_0$ satisfy the following formula: $P=\lambda+\lambda_0$. The period P, the width $\lambda$ and the distance $\lambda_0$ are measured in nanometers. The period P can be a constant, and $\lambda_0$ or $\lambda$ can be a dependent variable. Furthermore, one part of the three-dimensional nano-structures 102 can be aligned in a first period, and another part of the three-dimensional nano-structures 102 can be aligned in a second period. In one embodiment, the period P is about 200 nanometers, the width $\lambda$ is about 190 nanometers, and the distance $\lambda_0$ is about 10 nanometers.

The three-dimensional nano-structure array 10 includes the plurality of M-shaped three-dimensional nano-structures 102, thus the M-shaped three-dimensional nano-structures can be two layers of three-dimensional nano-structures assembled together. The plurality of M-shaped three-dimensional nano-structures 102 can be used in many fields such as nano-optics, nano-integrated circuits, and nano-integrated optics.

Figure 4:
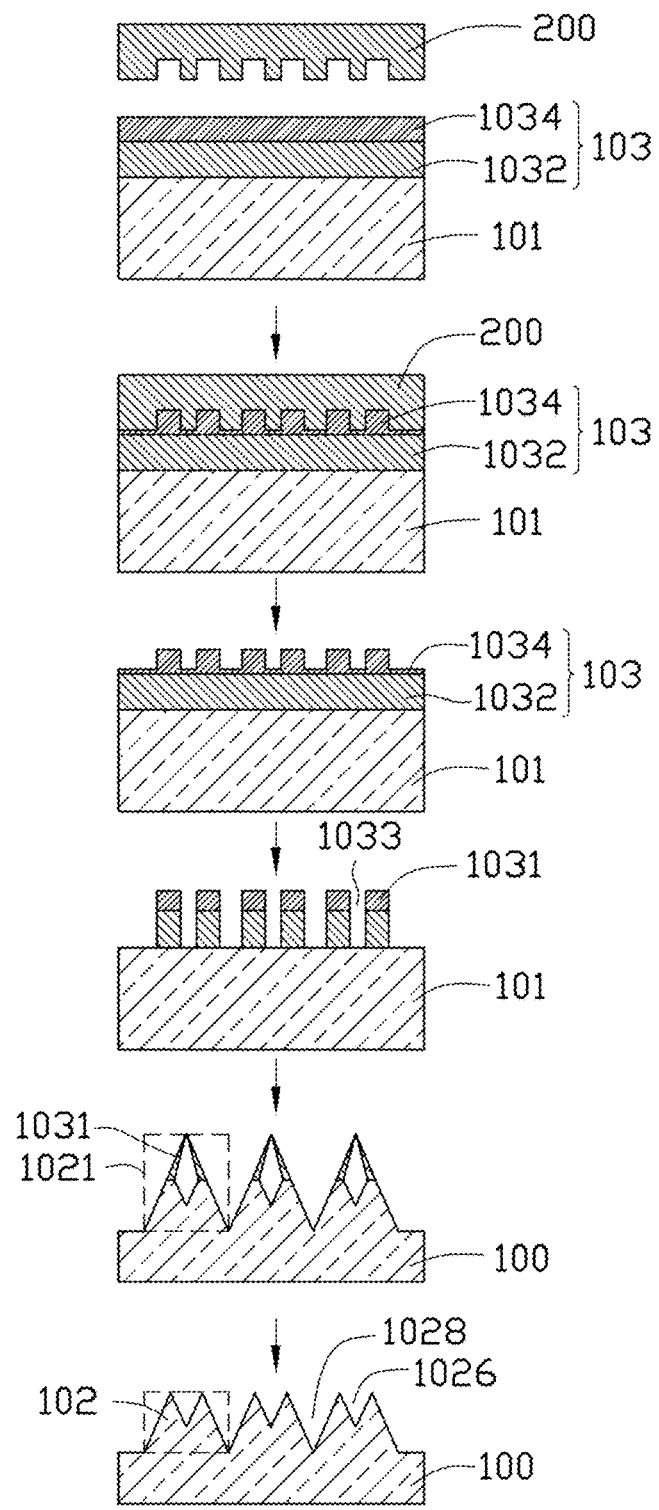
FIG. 4 shows a process of one embodiment of a method for making a three-dimensional nano-structure array.

Referring to FIG. 4, one embodiment of a method for making a three-dimensional nano-structure array 10 includes the following steps:

step (S10), providing a base 101;

step (S11), locating a mask layer 103 on a surface of the base 101;

step (S12), patterning the mask layer 103 by a nanoimprinting and etching method;

step (S13), patterning the surface of the base 101 by an etching method to form a plurality of three-dimensional nano-structure preforms 1021;

step (S14), forming a plurality of three-dimensional nano-structures 102 by removing the mask layer 103.

In step (S10), the base 101 can be an insulative base or a semiconductor base. The base 101 can be made of a material such as glass, quartz, Si, $SiO_2$, $Si_3N_4$, GaN, GaAs, $Al_2O_3$, or MgO. The base 101 can also be made of a doped material such as doped N-type GaN or P-type GaN. The base 101 can be cleaned in a clean room.

In step (S11), the mask layer 103 can be a single layered structure or a multi-layered structure. The thickness of the mask layer 103 can be selected according to the etching depth or the etching atmosphere. The patterned mask layer 103 formed in the following steps will have a high precision. If the mask layer 103 is a single layered structure, the material of the mask layer 103 can be ZEP520A which is developed by Zeon Corp of Japan, HSQ (hydrogen silsesquioxane), PMMA (Polymethylmethacrylate), PS (Polystyrene), SOG (silicon on glass) and other silitriangle oligomers. The mask layer 103 is used to protect a portion of the base 101. In one embodiment, the mask layer 103 is a multi-layered structure. The mask layer 103 includes a first mask layer 1032 and a second mask layer 1034 stacked on the base 101 in that order, with the second mask layer 1034 covering the first mask layer 1032. The first mask layer 1032 and the second mask layer 1034 can be selected according to need. The material of the first mask layer 1032 can be ZEP520A, PMMA, PS, SAL601 and ARZ720. The material of the second mask layer 1034 can be HSQ, SOG, and other silitriangle oligomers. The second mask layer 1034 can be easily printed by a mechanical method to ensure precision of the mask layer 103. In one embodiment, the material of the first mask layer 1032 is ZEP520A, and that of the second mask layer 1034 is HSQ. The first mask layer 1032 and the second mask layer 1034 can be formed by a screen printing method or a deposition method.

The step (S11) includes sub-steps of:

step (S111), forming the first mask layer 1032; and step (S112), forming the second mask layer 1034.

In step (S111), the first mask layer 1032 is formed by the following steps. First, the base 101 is cleaned in a clean room. A layer of positive electron-beam resist can be spin-coated on the base 101 at a speed of about 500 rounds per minute to about 6000 rounds per minute, for about 0.5 minutes to about 1.5 minutes. The positive electron-beam resist can be ZEP520A resist, which is developed by Zeon Corp of Japan. The base 101 with the positive electron-beam resist can be dried at a temperature of about 140 degrees centigrade to 180 degrees centigrade, for about 3 minutes to about 5 minutes, thereby forming the first mask layer 1032 on the base 101. The thickness of the first mask layer 1032 can be in a range of about 100 nanometers to about 500 nanometers.

In step (S111), the mask layer 1034 can be a layer of HSQ resist. The HSQ resist is spin-coated on the first mask layer 1032 under high pressure at a speed of about 2500 rounds per minute to about 7000 rounds per minute, for about 0.5 minutes to about 2 minutes. The thickness of the second mask layer 1032 can range from about 100 nanometers to about 300 nanometers. The HSQ can be pressed to deform at room temperature. Moreover, the HSQ has good structural stability, and provides a high resolution, often better than 10 nm.

Furthermore, a transition layer (not shown) can be deposited on the first mask layer 1032 before the step of forming the second mask layer 1034. In one embodiment, the transition layer can be a glassy silicon dioxide film with a thickness of about 10 nanometers to about 100 nanometers. The transition layer is used to protect the first mask layer 1032 during nanoimprinting the second mask layer 1034.

In step (S12), the mask layer 103 can be patterned by the following steps:

step (S121), providing a patterned template 200;

step (S122), attaching the template 200 on the second mask layer 1034, and pressing and removing the template 200 to form a plurality of slots on the second mask layer 1034;

step (S123), removing the residual second mask layer 1034 in the bottom of the slot to expose the first mask layer 1032; and step (S124), patterning the mask layer 103 by removing one part of the first mask layer 1032 corresponding with the slots.

In step (S121), the template 200 can be made of rigid materials, such as nickel, silicon, and carbon dioxide. The template 200 can also be made of flexible materials, such as PET, PMMA, polystyrene (PS), and polydimethylsiloxane (PDMS). The template 200 can be fabricated through an electron beam lithography method with the nano-pattern formed therein. The template 200 includes a plurality of protruding structures. The protruding structures are substantially parallel with and spaced from each other to form an array, concentric circles, or concentric rectangles. A slot is defined between the two adjacent protruding structures. The protruding structures form the nano-pattern of the template 200. The nano-pattern can be designed according to the actual application. In one embodiment, the protruding structures are bar-shaped extending substantially along the same direction. The width of the protruding structure and that of the slot can be substantially the same. In one embodiment, both the width of the protruding structure and that of the slot range from about 50 nanometers to about 200 nanometers.

In step (S122), the template 200 is pressed towards the base 101 at room temperature. During this process, the protruding structures are pressed into the second mask layer 1034 to form a plurality of slots in the second mask layer 1034, and some materials of the second mask layer 1034 remain at the bottom of the slot. Finally, the template 200 is removed, with only the nano-pattern remaining in the second mask layer 1034. The nano-pattern of the second mask layer 1034 includes a plurality of second protruding structures and a plurality of slots. The protruding structures in the second mask layer 1034 correspond to the slots in the template 200. The slots in the second mask layer 1034 correspond to the protruding structures in the template 200.

In one embodiment, the template 200 is pressed towards the base 101 at room temperature in a vacuum environment of about $1 \times 10^{-1}$ millibars to about $1 \times 10^{-5}$ millibars. The pressure applied on the template 200 is about 2 pounds per square foot to about 100 pounds per square foot. The pressure is applied on the template 200 for about 2 minutes to about 30 minutes. There may be material of the second mask layer 1034 remaining at the bottom of the slots.

In step (S123), the residual material of the second mask layer 1034 at the bottom of the slots can be removed by plasma etching. In one embodiment, a $CF_4$ reactive plasma etching method can be used to remove the remaining material of the second mask layer 1034 at the bottom of the slots. For example, the base 101 with the protruding structures and the slots formed in the second mask layer 1034 can be placed in a $CF_4$ reactive plasma etching system. The $CF_4$ reactive plasma etching system generates $CF_4$ plasma, and the $CF_4$ plasma then moves towards the second mask layer 1034. The material of the second mask layer 1034 remaining at the bottom of the slots will be etched away, so that the first mask layer 1032 corresponding to the slots will be exposed. At the same time, the width of the top of the protruding structures in the second mask layer 1034 is decreased during the etching process. However, the nano-pattern in the second mask layer 1034 will be maintained.

In step (S124), the first mask layer 1032 exposed by the slots can be removed by oxygen plasma etching. For example, the base 101 after being treated by step (S123) can be placed in an oxygen plasma etching system. The power of the oxygen plasma etching system can in a range of about 10 watts to about 150 watts. The speed of the oxygen plasma can be about 2 sccm to about 100 sccm. The partial pressure of the oxygen plasma can be about 0.5 Pa to about 15 Pa. The etching time can be about 5 seconds to about 1 minute. During the process of etching the first mask layer 1032, the first mask layer 1032 exposed by the slots will be removed, and the base 101 corresponding to the slots will be exposed. The protruding structures in the second mask layer 1034 function as a mask to the oxygen plasma to ensure the resolution of the first mask layer 1032.

During the etching process, the pattern in the second mask layer 1034 will be copied onto the first mask layer 1032 to form a patterned mask layer 103. The patterned mask layer 103 includes a plurality of protruding structures 1031 on the surface of the base 101. Each protruding structure 1031 includes the first mask layer 1032 and the second mask layer 1034 stacked together. A slot 1033 is defined between every two adjacent protruding structures 1031, and the surface of the base 101 corresponding to the slot 1033 is exposed. During the process of etching the first mask layer 1032, the top of the protruding structures of the second mask layer 1034 will also be partly etched. The nano-pattern in the second mask layer 1034 can still be maintained because the speed of etching the second mask layer 1034 is much smaller than that of the first mask layer 1032. Thus, the resolution of the mask layer 103 can be improved.

In step (S13), the base 101 after step (S12) can be placed in an inductively coupled plasma device to etch the base 101 exposed by the mask layer 103. The etching gas can be selected according to the material of the base 101 and the mask layer 103. During the etching process, the surface of the base 101 exposed by the slots 1033 of the mask layer 103 will be etched, thereby forming a plurality of grooves in the base 101.

Figure 5:
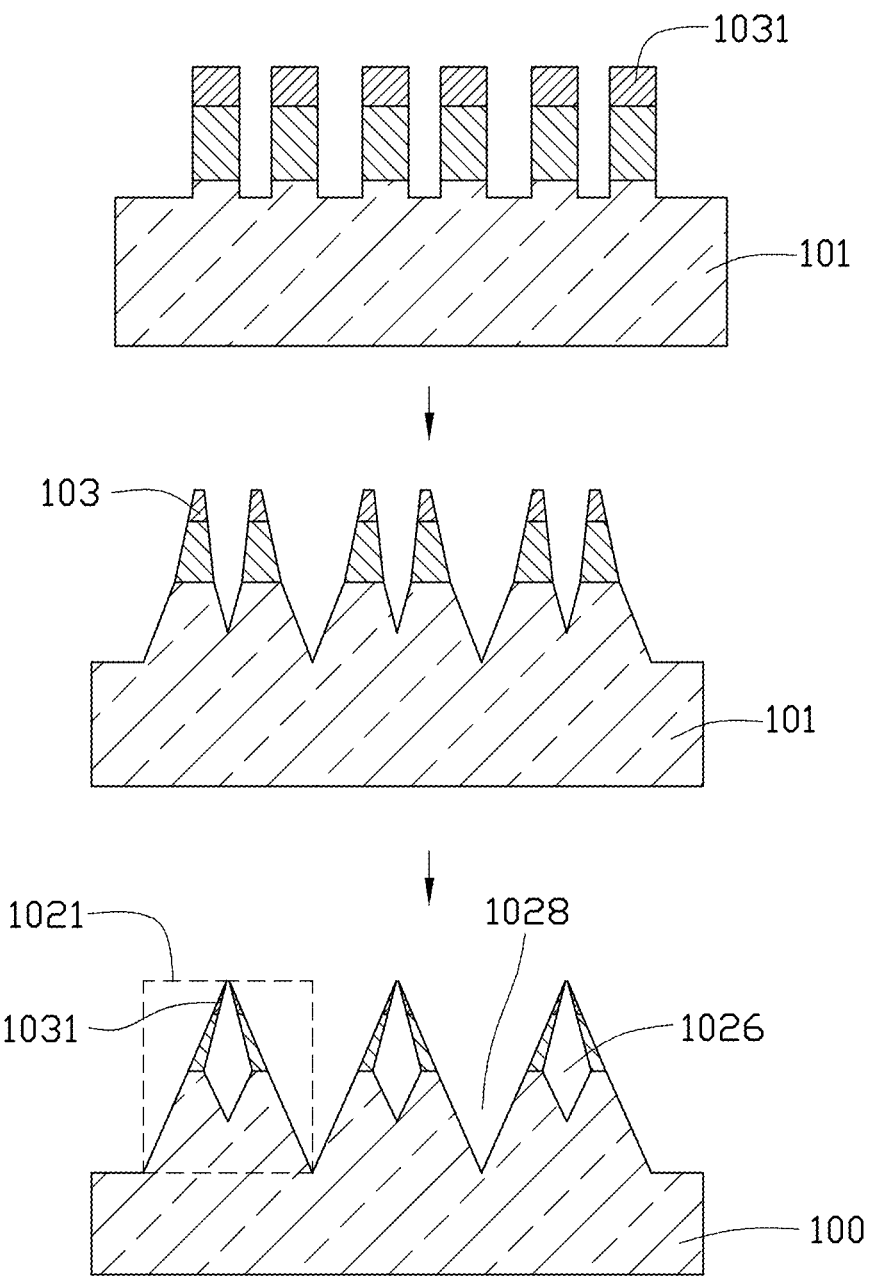
FIG. 5 shows a process of one embodiment of forming a three-dimensional nano-structure array perform in the method of FIG. 4.
Figure 6:
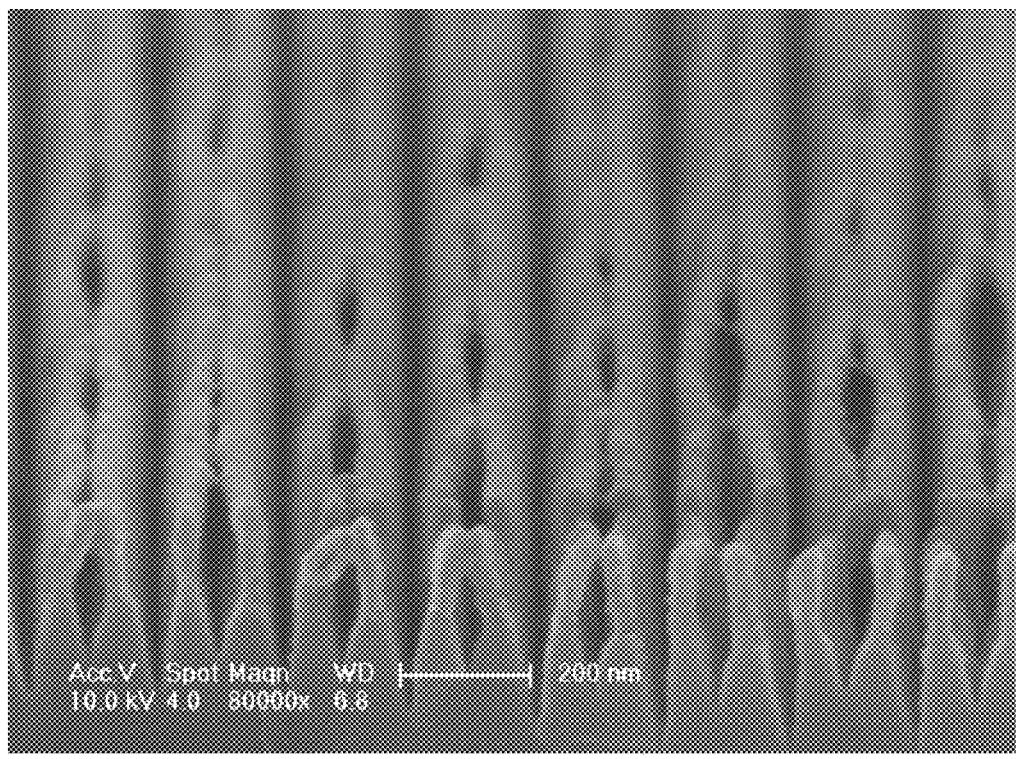
FIG. 6 is an SEM image of a three-dimensional nano-structure array preform of FIG. 5.

Referring to FIG. 5 and FIG. 6, the etching process includes the following substeps:

first stage, form a plurality of grooves with the same depth by etching the surface of the base 101 with the etching gas;

second stage, continuing the etching process so that every two adjacent protruding structures 1031 begin to slant face to face to form a protruding pair; and third stage, continuing the etching process so that the two adjacent protruding structures 1031 gradually slant until the tops of the two adjacent protruding structures 1031 contact each other.

In the first stage, the etching gas etches the exposed surface of the base 101 to form a plurality of grooves. The grooves have the same depth because of the same etching speed.

In the second stage, during the etching process, the etching gas will react with the base 101 to form a protective layer. The protective layer will reduce the etching speed of the base 101, and the width of the grooves will slowly decrease from the outer surface of the base 101 to the bottom of the grooves. Thus, the inner wall of the grooves will be not absolutely perpendicular to the surface of the base 101, but form an angle. The etching gas not only etches the base 101, but also etches the top of the protruding structures 1031. The width of the top of the protruding structures 1031 will decrease. The resolution of the mask layer 103 will not be affected because the speed of etching the top of the protruding structures 1031 is much smaller than that of the base 101. Furthermore, every two adjacent protruding structures 1031 will slant face to face.

In the third stage, the tops of the two adjacent protruding structures 1031 will gradually approach to each other. The speed of etching the base 101 corresponding to these two closed adjacent protruding structures 1031 will decrease, and the width of the grooves will gradually decrease from the outer surface of the base 101 to the bottom of the grooves of the base 101. Because the two adjacent protruding structures 1031 slant face to face to form a protruding pair, the speed of etching the base 101 corresponding to the protruding pair will further decrease. Eventually, the tops of the two adjacent protruding structures 103 contact each other, and the etching gas can no longer etch the base 101 corresponding to the two adjacent protruding structures 103, thus the first groove 1026 is formed on the surface of the base 101. But between every two adjacent protruding pairs, the etching speed will change less than the slant two adjacent protruding structures 1031. Thus the second grooves 1028 are formed, and the depth of the second grooves 1028 will be greater than that of the first grooves 1026. The plurality of three-dimensional nano-structure preforms 1021 is obtained on the substrate 100.

In one embodiment, the etching gas includes $Cl_2$, $BCl_3$, $O_2$ and Ar. The power of the inductively coupled plasma device ranges from about 10 watts to about 100 watts, the flow speed of the etching gas ranges from about 8 sccm to about 150 sccm, the pressure of the etching gas can range from about 0.5 Pa to about 15 Pa, and the etching time can range from about 5 seconds to about 5 minutes. In the etching gas, the flow speed of the $Cl_2$ ranges about 2 sccm to about 60 sccm, the flow speed of the $BCl_3$ ranges from about 2 sccm to about 30 sccm, the flow speed of the $O_2$ ranges from about 3 sccm to about 40 sccm, and the flow speed of the Ar ranges from about 1 sccm to about 20 sccm. In one embodiment, the flow speed of the etching gas ranges from about 40 sccm to about 100 sccm to improve the resolution and the etching speed. In another embodiment, the power of the inductively coupled plasma device is about 70 watts, the flow speed of the etching gas is about 40 sccm, the pressure of the etching gas is about 2 Pa, and the etching time is about 2 minutes. In the etching gas, the flow speed of the $Cl_2$ is about 26 sccm, the flow speed of the $BCl_3$ is about 16 sccm, the flow speed of the $O_2$ is about 20 sccm, and the flow speed of the Ar is about 10 sccm.

The mask layer 103 and the etching gas are not limited as described above. The etching gas can include one gas or a mixture of different gases, so long as the tops of the two adjacent protruding structures 1031 in the mask layer 103 can be closed. The flow speed of the etching gas, the pressure, the etching time, and the ratio between the different gases can be can be dependent upon the three-dimensional nano-structure 102.

In step (S14), the three-dimensional nano-structure 102 can be obtained by dissolving the mask layer 103. The mask layer 103 can be dissolved in a stripping agent such as tetrahydrofuran (THF), acetone, butanone, cyclohexane, hexane, methanol, or ethanol. In one embodiment, the stripping agent is butanone, and the mask layer 103 is dissolved in butanone and separated from the base 101. The mask layer 103 is removed to form the substrate 100 and the plurality of three-dimensional nano-structures 102 located on the substrate 100. The plurality of three-dimensional nano-structures and the substrate 100 are integrated to form an integrated structure.

The method for making the three-dimensional structure has the following advantages. First, the second mask layer is made from the HSQ resist, which can be imprinted at room temperature, and the HSQ has small deformation in the subsequent manufacturing process, thereby ensuring the accuracy of subsequent etching. Second, the first mask layer is sandwiched between the substrate and the second mask layer, and the second mask layer will protect the first mask layer in the etching process to ensure good resolution of the first mask layer. Third, the nano-imprinting method can be carried out at room temperature, and the template does not need pre-treatment. Thus, the method is simple and low in cost. Fourth, the plurality of M-shaped three-dimensional structures can be easily formed on the substrate, and the productivity of the patterned substrate can be improved. Fifth, the mask layer can be selected according to the material of the substrate to etch different kinds of substrates.

Figure 7:
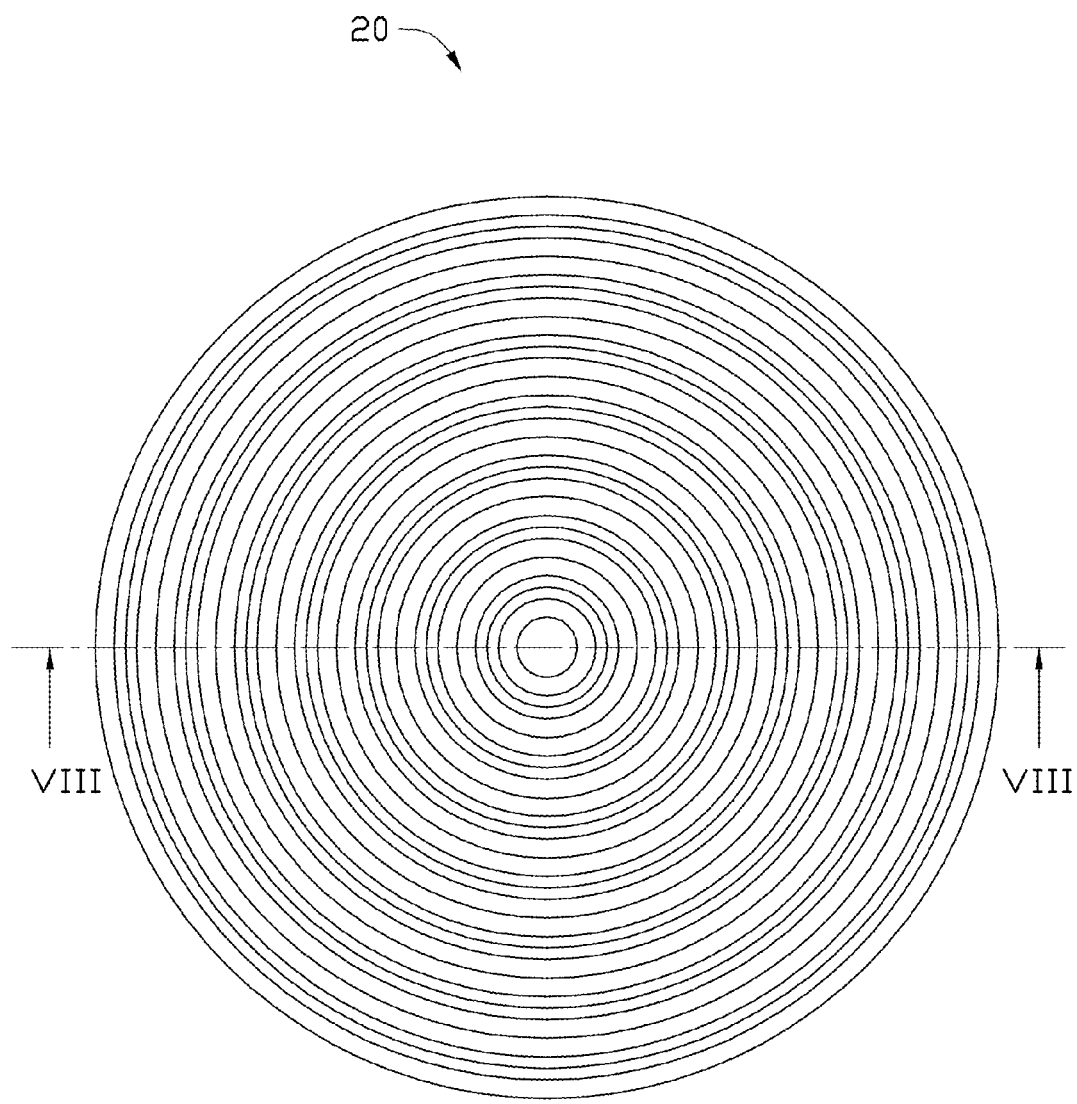
FIG. 7 is a top view of one embodiment of a three-dimensional nano-structure array.
Figure 8:
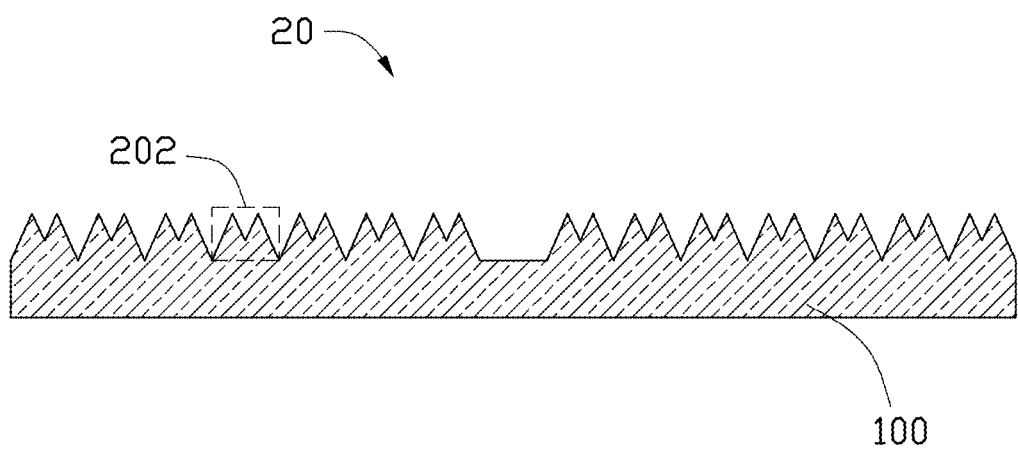
FIG. 8 is a cross-sectional view, along a line VIII-VIII of FIG. 7.

Referring to FIG. 7 and FIG. 8, a three-dimensional nano-structure array 20 of one embodiment includes a substrate 100 and a number of three-dimensional nano-structures 202 located on at least one surface of the substrate 100. Each three-dimensional nano-structure 202 is an M-shaped structure. The three-dimensional nano-structures 202 are similar to the three-dimensional nano-structures 102, except that the plurality of three-dimensional nano-structures 202 is aligned side by side and extends to form a plurality of concentric circles. Each of the plurality of three-dimensional nano-structures 202 is a double-peak structure including two peaks, and the three-dimensional nano-structure 202 forms a circle. The cross-section of the three-dimensional nano-structures 202 is M-shaped. The plurality of three-dimensional nano-structures 202 can cover the entire surface of the substrate 100.

Figure 9:
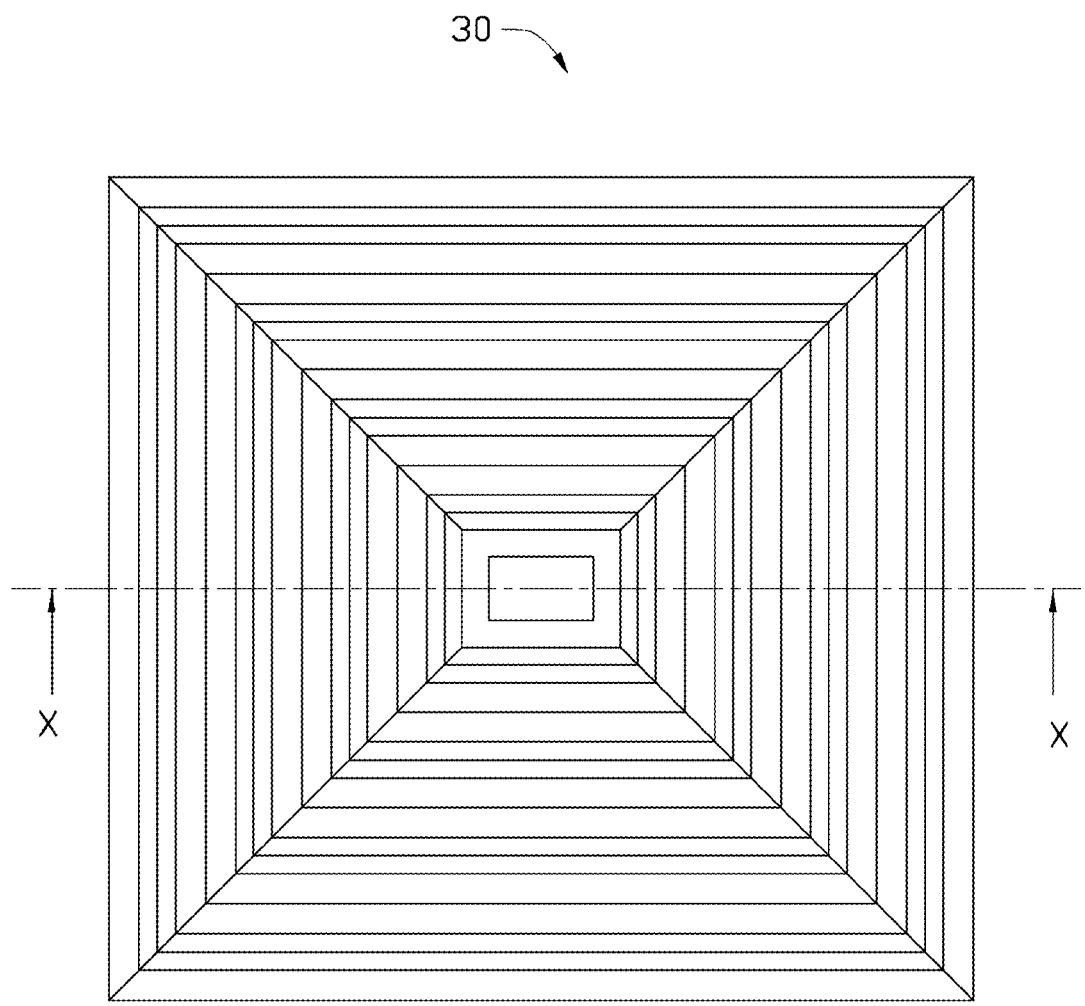
FIG. 9 is a top view of one embodiment of a three-dimensional nano-structure array.
Figure 10:
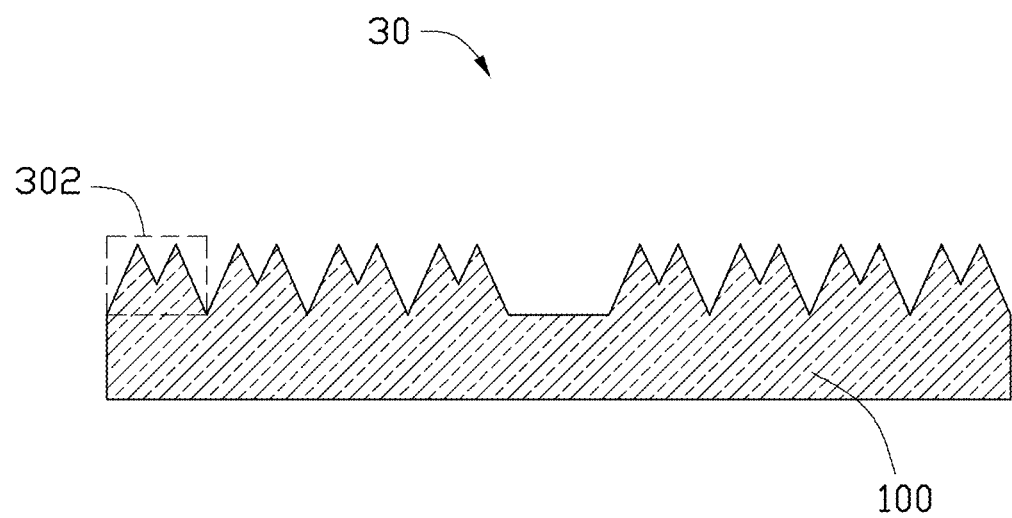
FIG. 10 is a cross-sectional view, along a line X-X of FIG. 9.

Referring to FIG. 9 and FIG. 10, one embodiment of a three-dimensional nano-structure array 30 includes a substrate 100 and a number of three-dimensional nano-structures 302 located on at least one surface of the substrate 100. Each of the three-dimensional nano-structures 302 is an M-shaped structure. The three-dimensional nano-structure 302 is similar to the three-dimensional nano-structures 102, except that the plurality of three-dimensional nano-structures 302 is aligned side by side and extends to form a plurality of concentric rectangles. Each three-dimensional nano-structure 302 is a double-peak structure including two peaks, and the three-dimensional nano-structure 302 forms a rectangle. The cross-section of the three-dimensional nano-structures 302 is M-shaped. The plurality of three-dimensional nano-structures 302 can cover the entire surface of the substrate 100.

It is to be understood that the above-described embodiments are intended to illustrate rather than limit the disclosure. Any elements described in accordance with any embodiments is understood that they can be used in addition or substituted in other embodiments. Embodiments can also be used together. Variations may be made to the embodiments without departing from the spirit of the disclosure. The above-described embodiments illustrate the scope of the disclosure but do not restrict the scope of the disclosure.

Depending on the embodiment, certain of the steps of methods described may be removed, others may be added, and the sequence of steps may be altered. It is also to be understood that the description and the claims drawn to a method may include some indication in reference to certain steps. However, the indication used is only to be viewed for identification purposes and not as a suggestion as to an order for the steps.

What is claimed is:

1. A three-dimensional nano-structure array, comprising:
a substrate having a plurality of three-dimensional nano-structures extending along the same direction, wherein each of the three-dimensional nano-structures has a first peak and a second peak aligned side by side, a first groove is defined between the first peak and the second peak, a second groove is defined between every two adjacent three-dimensional nano-structures of the three-dimensional nano-structures, and a first depth of the first groove is smaller than a second depth of the second groove, a width of each of the plurality of three-dimensional nano-structures ranges from about 100 nanometers to about 300 nanometers, the first peak and the second peak have a same height, the first depth of the first groove ranges from about 30 nanometers to about 120 nanometers, and the second depth of the second groove ranges from about 100 nanometers to about 200 nanometers; wherein a first portion of the plurality of three-dimensional nano-structures are aligned along a first period P, a second portion of the plurality of three-dimensional nano-structures are aligned along a second period P', and P≠P'.

2. The three-dimensional nano-structure array of claim 1, wherein each three-dimensional nano-structure extends along a straight line, a curvy line, or a polygonal line.

3. The three-dimensional nano-structure array of claim 1, wherein a cross-section of each three-dimensional nano-structure is M-shaped.

4. The three-dimensional nano-structure array of claim 1, wherein a cross-section of the first peak is trapezoidal or triangular, and a cross-section of the second peak is trapezoidal or triangular.

5. The three-dimensional nano-structure array of claim 1, wherein the first peak comprises a first surface and a second surface intersected with each other to form a first include angle, and the second peak comprises a third surface and the fourth surface intersected with each other to form a second include angle, both the first include angle and the second include angle range from about 30 degrees to about 90 degrees.

6. The three-dimensional nano-structure array of claim 1, wherein both the first peak and the second peak have the highest point, a distance between the highest point of the first peak and the highest point of the second peak is smaller than the width of each three-dimensional nano-structure.

7. The three-dimensional nano-structure array of claim 1, wherein a distance between every two adjacent three-dimensional nanostructures of the three-dimensional nano-structures is substantially equal.

8. The three-dimensional nano-structure array of claim 7, wherein the distance between every two adjacent three-dimensional nanostructures of the three-dimensional nano-structures ranges from about 0 nanometers to about 200 nanometers.

9. The three-dimensional nano-structure array of claim 1, wherein the plurality of three-dimensional nano-structures is periodically aligned, and a period of the plurality of three-dimensional nano-structures ranges from about 100 nanometers to about 500 nanometers.

10. The three-dimensional nano-structure array of claim 1, wherein a cross-section of the first groove is V-shaped.

11. The three-dimensional nano-structure array of claim 1, wherein a cross-section of the second groove is V-shaped or inverse trapezium.

12. The three-dimensional nano-structure array of claim 1, wherein the plurality of three-dimensional nano-structures and the substrate are integrated to form an integrated structure.

13. The three-dimensional nano-structure array of claim 1, wherein the plurality of three-dimensional nano-structures is aligned side by side and extends to form a plurality of concentric circles.

14. The three-dimensional nano-structure array of claim 1, wherein the plurality of three-dimensional nano-structures is aligned side by side and extends to form a plurality of concentric rectangles.

15. The three-dimensional nano-structure array of claim 1, wherein the first groove, the second groove, the first peak and the second groove extend substantially along the same direction.

16. A three-dimensional nano-structure array, comprising:
a substrate comprising a surface, and a plurality of first grooves and a plurality of second grooves alternately defined in the surface, the plurality of first grooves and the plurality of second grooves extending substantially along the same direction, and a first depth of the first groove is lower than a second depth of the second groove, the first depth ranges from about 30 nanometers to about 120 nanometers, and the second depth ranges from about 100 nanometers to about 200 nanometers; wherein a first portion of the plurality of three-dimensional nano-structures are aligned along a first period P, a second portion of the plurality of three-dimensional nano-structures are aligned along a second period P', and P≠P'.

17. A three-dimensional nano-structure array, comprising:
a substrate comprising a plurality of three-dimensional nano-structures, wherein the plurality of three-dimensional nano-structures are aligned side by side to form an array, and extend along the same direction, and a cross-section of each three-dimensional nano-structure is M-shaped, each of the plurality of three-dimensional nano-structures has a first peak and a second peak aligned side by side, the first peak and the second peak have a same height, a first groove is defined between the first peak and the second peak, a second groove is defined between every two adjacent three-dimensional nano-structures of the plurality of three-dimensional nano-structures, and a first depth of the first groove is smaller than a second depth of the second groove; a width of each of the plurality of three-dimensional nano-structures ranges from about 100 nanometers to about 300 nanometers, a first depth of the first groove ranges from about 30 nanometers to about 120 nanometers, and a second depth of the second groove ranges from about 100 nanometers to about 200 nanometers; wherein a distance between every two adjacent three-dimensional nano-structures of the plurality of three-dimensional nano-structures is periodically varied.

18. The three-dimensional nano-structure array of claim 1, wherein a ratio between the first depth and the second depth ranges from 1:1.2 to 1:3.

* * * * *